(12) United States Patent
Singh et al.

(10) Patent No.: US 7,371,282 B2
(45) Date of Patent: May 13, 2008

(54) SOLID SOLUTION WIDE BANDGAP SEMICONDUCTOR MATERIALS

(75) Inventors: Narsingh Bahadur Singh, Ellicott City, MD (US); Brian Wagner, Baltimore, MD (US); Mike Aumer, Laurel, MD (US); Darren Thomson, Ellicott City, MD (US); David Kahler, Arbutus, MD (US); Andre Berghmans, Owing Mills, MD (US); David J. Knuteson, Linthicum, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/484,691

(22) Filed: Jul. 12, 2006

(65) Prior Publication Data
US 2008/0011223 A1 Jan. 17, 2008

(51) Int. Cl.
*C30B 25/12* (2006.01)
*C30B 25/14* (2006.01)

(52) U.S. Cl. ............... 117/104; 117/68; 117/84; 117/89

(58) Field of Classification Search ............... 117/68, 117/84, 89, 104
See application file for complete search history.

(56) References Cited

U.S. PATENT DOCUMENTS 3,979,271 A * 9/1976 Noreika et al. ......... 204/192.25
5,700,551 A * 12/1997 Kukino et al. ............ 428/212

FOREIGN PATENT DOCUMENTS

| JP | 08-078202 | * | 3/1996 |
| JP | 10053495 | * | 2/1998 |
| JP | 20029053398 | * | 2/2002 |

* cited by examiner

*Primary Examiner*—Felisa Hiteshew
(74) *Attorney, Agent, or Firm*—Andrews Kurth LLP

(57) ABSTRACT

A substrate and method for growing a semi-conductive crystal on an alloy film such as $(AlN)_x(SiC)_{(1-x)}$ without any buffer layer is disclosed. The $(AlN)_x(SiC)_{(1-x)}$ alloy film can be formed on a SiC substrate by a vapor deposition process using AlN and SiC powder as starting materials. The $(AlN)_x(SiC)_{(1-x)}$ alloy film provides a better lattice match for GaN or SiC epitaxial growth and reduces defects in epitaxially grown GaN with better lattice match and chemistry.

17 Claims, 7 Drawing Sheets

Morphology of GaN grown by MOCVD on $(AlN)_x(SiC)_{1-x}$ substrate

SOLID SOLUTION WIDE BANDGAP SEMICONDUCTOR MATERIALS

TECHNICAL FIELD

The invention relates generally to semiconductor materials, and more particularly to methods for producing high quality modified SiC and crystal substrates for GaN film growth.

BACKGROUND OF THE INVENTION

The development of modern electronic devices places an ever increasing demand on the quality of the semiconductor materials used in these devices. However, the epitaxially grown semiconductor crystals produced with today's technology are highly defective and adversely affect the performance and reliability of the device employing the crystal.

The poor quality of the epitaxially grown semiconductor crystals is generally due to the unavailability of a lattice matched and chemically matched substrate. When a film is grown on a substrate or an underlying layer such that the crystal structure of the substrate or underlying layer is reflected on the film, the thus-grown film exhibits microstructural discontinuity at the interface between layers formed of different semiconductor materials. Since the thickness of the film is considerably smaller than that of the substrate, the difference in lattice constant between the film and the substrate causes generation of strain and defects in the film.

For example, when a crystal of a nitride semiconductor such as gallium nitride (GaN) is grown on a starting substrate made of silicon (Si) or the like and then cooled to the ordinary temperature, a large number of dislocations and cracks occur in the nitride semiconductor layer because of stress caused by the difference in thermal expansion coefficient or lattice constant. If a large number of dislocations and cracks occur in the growth layer (nitride semiconductor layer), lattice defects or a large number of dislocations, deformations, cracks, etc., occur in a film when the film is epitaxially formed on the growth layer. This causes deterioration of the film characteristic.

To improve lattice match, a buffer layer can be formed on a substrate, and subsequently a crystal of a semiconductor is grown on the buffer layer. The buffer layer can lower the adverse effect of defects in the surface of the substrate on the crystal, and reduce propagation of lattice defects contained in the substrate. However, in some cases, because of microstructural discontinuity at the substrate/buffer interface, defects are newly generated at the interface.

Therefore, demand has arisen for an epitaxially grown compound semiconductor film of reduced crystal defect density.

SUMMARY OF THE INVENTION

One aspect of the present invention relates to a method for producing a wide bandgap semiconductor crystal. The method comprises the step of depositing a semiconductor material on an alloy film by a vapor deposition method. The semiconductor material is nitride, carbide or diamond, and wherein the alloy is $(AlN)_x(SiC)_{(1-x)}$ or $Si_xGe_{(-x)}C$, where $0<x<1$.

In one embodiment, the alloy film provides a better lattice match for GaN or SiC epitaxial growth, and reduces defects in epitaxially grown GaN and SiC films.

In one embodiment, the method further comprises the step of forming the alloy film by a vapor deposition method on a substrate prior to depositing the semiconductor material.

In another embodiment, the method further comprises the step of doping the substrate prior to the formation of the alloy film.

In another embodiment, the AlN or SiC is deposited on the alloy film by physical vapor transport (PVT), advanced PVT (APVT), or chemical vapor deposition (CVD).

In another embodiment, the alloy film is formed by physical vapor transport (PVT), advanced PVT (APVT), or chemical vapor deposition (CVD).

Another aspect of the present invention relates to a method for producing an AlN-rich $(AlN)_x(SiC)_{(1-x)}$ alloy film on a substrate. The method comprises the step of depositing AlN and SiC on the substrate to form an $(AlN)_x(SiC)_{(1-x)}$ alloy film in a PVT process under a background pressure of less than 100 torr using AlN and GaN powder as starting materials.

Another aspect of the present invention relates to a method for producing a SiC-rich $(AlN)_x(SiC)_{(1-x)}$ alloy film on a substrate. The method comprises the step of depositing AlN and SiC on the substrate to form an $(AlN)_x(SiC)_{(1-x)}$ alloy film in a PVT process under a background pressure of 400-500 torr using AlN and GaN powder as starting materials.

Yet another aspect of the present invention relates to AlN and SiC crystals produced by the method of the present invention.

DETAILED DESCRIPTION OF DRAWINGS

DETAILED DESCRIPTION OF THE INVENTION

Figure 1:
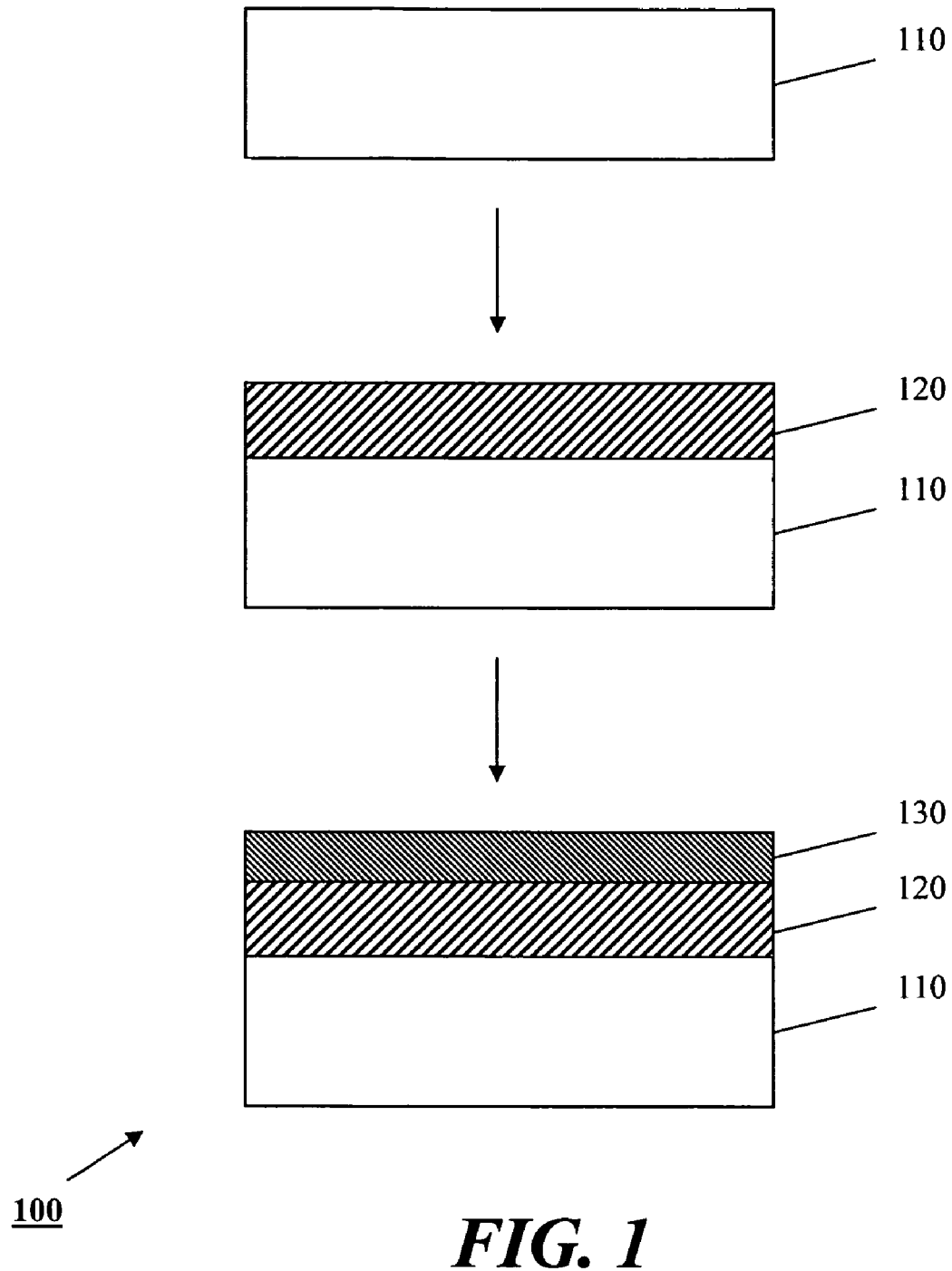
FIG. 1 is a schematic showing a method for growing a semiconductor crystal on an alloy film formed on a substrate.
Figure 2:
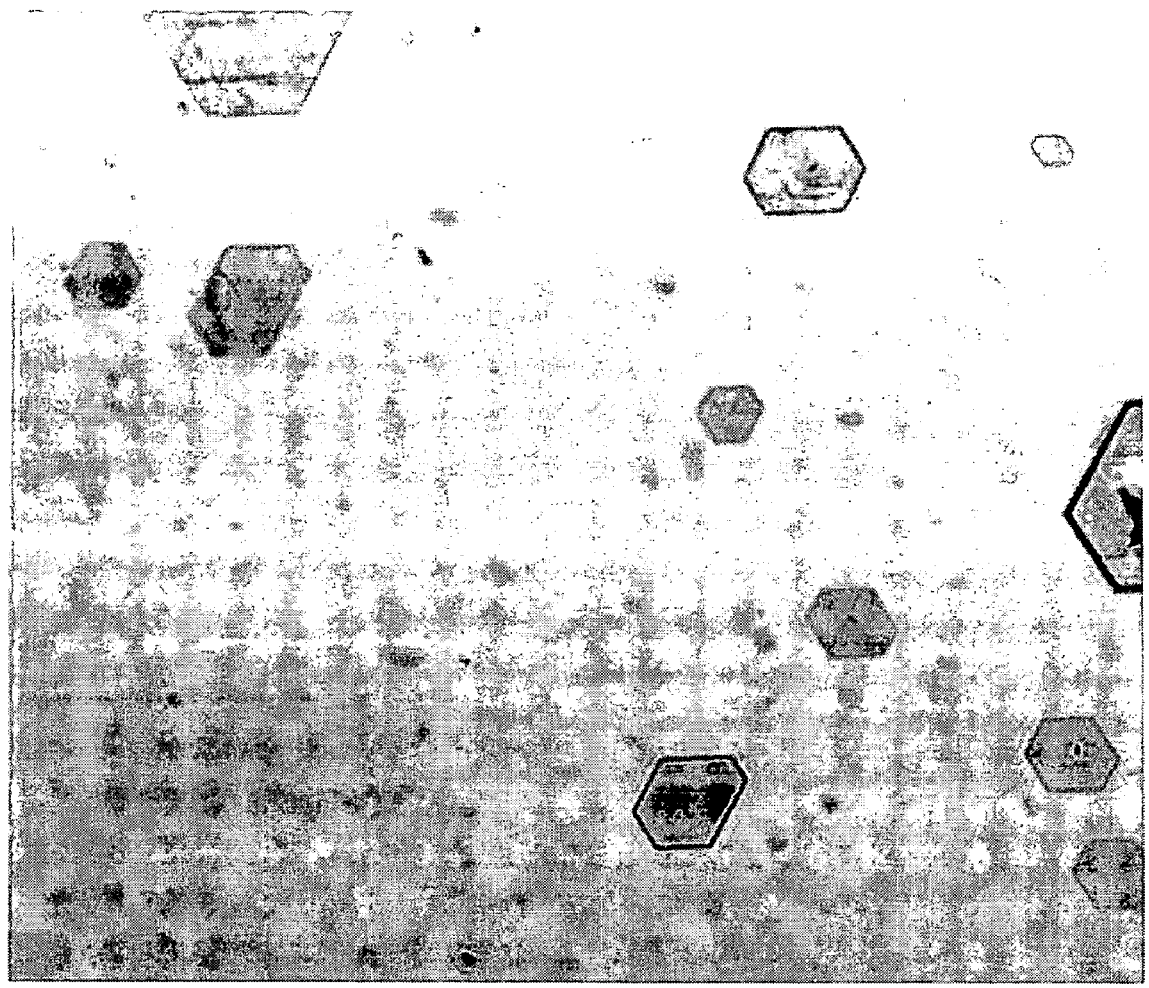
FIG. 2 is a picture of $(AlN)_x(SiC)_{(1-x)}$ alloy film on axis SiC wafer.

FIG. 1 schematically shows a process 100 for growing a semiconductor material on an alloy film. The process include the steps of growing an alloy film 120 on a substrate 110, and epitaxially growing a target crystal 130 on the alloy film 120.

The Substrate

The substrate 110 can be carbon, silicon or silicon carbide (SiC) crystals of various modifications (polytypes). Examples of SiC include, but are not limited to, 3C—SiC (cubic unit cell, zincblende), 2H—SiC; 4H—SiC; 6H—SiC (hexagonal unit cell, wurtzile); 15R—SiC (rhombohedral unit cell), 21R—SiC 24R—SiC, and 27R—SiC. The growing surface can be either off axis or on axis. In one embodiment, the substrate 110 is <001> 6H SiC. In another embodiment, the substrate 110 is on axis <001> 6H SiC.

The substrate 110 can also be a doped SiC. Examples of doped SiC include, but are not limited to, n-type doped SiC such as SiC doped with nitrogen, and p-type SiC such as SiC doped with Al, B, Ga, Sc, P, Fe, and Va. Dopants may be introduced either during epitaxy or by ion implantation. In one embodiment, ammonia (NH3) or tri-methyl aluminum (TMA) is used as dopant source for n- or p-type doping by CVD, respectively. A hydrogen gas purified with a Pd cell is used as carrier. The CVD is preformed under the pressure of an inert gas, such as nitrogen or argon, under pressure at 1-500 torr, preferably at 5-100 torr, and more preferably at 10-20 torr. The CVD is preformed at a temperature range from about 1600° C. to about 2300° C., preferably from about 1800° C. to about 2100° C., and more preferably at about 1900° C. to about 2000° C.

The Alloy

The alloy 120 is epitaxially grown on the substrate 110 using a vapor deposition technique. Vapor deposition techniques provide the advantage of growing a crystal at a temperature below its melting point. Examples of vapor deposition techniques include, but are not limited to, physical vapor transport (PVT), advanced PVT (APVT), and chemical vapor deposition (CVD). In the PVT process, the vapor pressure of a material is maintained high enough so that a crystal can be efficiently grown from the supersaturated vapor. In the APVT process, in situ synthesis and growth of the crystal occurs simultaneously.

In the CVD process, a chemical reaction is utilized to deposit a solid material from a gaseous phase. CVD includes processes such as Atmospheric Pressure Chemical Vapor Deposition (APCVD), Low Pressure Chemical Vapor Deposition (LPCVD), High Temperature Chemical Vapor Deposition (HTCVD), Metal-Organic Chemical Vapor Deposition (MOCVD), Plasma Assisted Chemical Vapor Deposition (PACVD) or Plasma Enhanced Chemical Vapor Deposition (PECVD), Laser Chemical Vapor Deposition (LCVD), Photochemical Vapor Deposition (PCVD), Hot Wire CVD (HWCVD), Chemical Vapor Infiltration (CVI) and Chemical Beam Epitaxy (CBE), and Hydride Vapor Phase Epitaxy (HVPE).

The alloy 120 is produced from two or more starting materials, such as AlN and SiC powders, or GeC and SiC powders. In one embodiment, a $(AlN)_x(SiC)_{(1-x)}$ alloy (where 0<x<1) is produced by PVT or APVT using SiC and AlN powders. The PVT is preformed under the pressure of an gas, such as nitrogen or argon, with a pressure range of 1-500 torr and a temperature range from about 1600° C. to about 2100° C., preferably from about 1700° C. to about 2000° C., and more preferably at about 1800° C. to about 1900° C.

The AlN-to-SiC ratio in the $(AlN)_x(SiC)_{(1-x)}$ alloy is determined by the background pressure of the vapor deposition process, as well as the AlN-to-SiC ratio of the AlN and SiC powder. $(AlN)_x(SiC)_{(1-x)}$ alloys having different AlN-to-SiC ratios can be obtained by adjusting the AlN-to-SiC ratio in the starting materials (i.e., the ALN and SiC powders) and by varying the background pressure. For example, with a starting material of a 1:1 mixture of AlN and SiC powder, $(AlN)_x(SiC)_{(1-x)}$ alloys formed under a low background pressure (e.g., 50-150 torr) tends to be AlN-rich alloys ($x \geq 0.7$), while the $(AlN)_x(SiC)_{(1-x)}$ alloys formed under a high background pressure (e.g., 400-500 torr) tends to be SiC-rich alloys ($x \leq 0.5$).

The AlN-to-SiC ratio determines the lattice parameters, such as the lattice constant of GaN and bandgap of the $(AlN)_x(SiC)_{(1-x)}$ alloy. For example, AlN-rich $(AlN)_x(SiC)_{(1-x)}$ alloys have lattice constants and bandgaps that are closer to that of AlN. While SiC-rich $(AlN)_x(SiC)_{(1-x)}$ alloys have lattice constants and bandgaps that are closer to that of SiC. Accordingly, the AlN-to-SiC ratio in the starting materials and the background pressure of the vapor deposition are selected based on the intended application of the $(AlN)_x(SiC)_{(1-x)}$ alloy.

For example, if the $(AlN)_x(SiC)_{(1-x)}$ alloy is used as the substrate to grow GaN crystals, a high AlN-to-SiC ratio is preferred because AlN provides a better lattice match to GaN. The lattice constants for SiC, GaN and AlN are 3.073° A, 3.189° A and 3.112° A. By increasing the concentration of AlN, the lattice parameter moves closer to the lattice parameter of GaN and hence better epitaxial growth is possible. In one embodiment, the AlN-to-SiC ratio in the original powder is in the range of 1:1 to 5:1, and the background pressure is in the range of 1-200 torr.

On the other hand, if the $(AlN)_x(SiC)_{(1-x)}$ alloy is used to grow SiC crystals, a low AlN-to-SiC ratio is preferred. In one embodiment, the AlN-to-SiC ratio in the original powder is within the range of 1:5 to 1:1, and the background pressure is in the range of 300-500 torr.

In another embodiment, the $(AlN)_x(SiC)_{(1-x)}$ alloy is produced by MOCVD on a SiC wafer. The MOCVD process allows a lower operating temperature (1000° C.-1300° C.) compared to the PVT process, which typically requires an operating temperature in the range of 1600° C.-2100° C.

In another embodiment, the $(AlN)_x(SiC)_{(1-x)}$ alloy is used to grow diamond film that requires very high temperature CVD.

In another embodiment, the alloy film can be grown by CVD and MOCVD using hexamethyldisilizane (HMDS). HMDS enables the growth at low temperature. Since HMDS decomposes at low temperature, ammonia can be used as nutrient for supplying nitrogen and trimethyl aluminum (TMA) for aluminum source.

In another embodiment, a $Si_xGe_{(1-x)}C/SiC$ and $(AlN)_x(SiC)_{(1-x)}$ alloys are produced using PVD and other methods for SiC heterostructure devices.

The Target Crystals

The target crystal 130 is a crystal of a wide bandgap semi-conductive material. Examples of the target crystal 130 include, but are not limited to, GaN, SiC and diamond. The target crystal 130 can be grown on alloy film 120 using a vapor deposition method such as PVT, APVT or CVD. Compared to the conventional processes that grow GaN and SiC on SiC or Si wafer, the alloy provides larger thermal conductivity, larger bandgap, better lattice match, better control of nucleation, and hence better crystal quality.

Another aspect of the present invention relates to GaN and SiC crystals grown on a $(AlN)_x(SiC)_{(1-x)}$ alloy film using the method described in the present invention. In one embodiment, the GaN crystal is epitaxially grown by PVT on an AlN-rich $(AlN)_x(SiC)_{(1-x)}$ alloy film formed on a SiC substrate. In another embodiment, the SiC crystal is epitaxially grown by PVT on a SiC-rich $(AlN)_x(SiC)_{(1-x)}$ alloy film formed on a SiC substrate. As used herein, the term "AlN-rich $(AlN)_x(SiC)_{(1-x)}$ alloy" refers to an $(AlN)_x(SiC)_{(1-x)}$ alloy where $x \geq 0.7$, while the term "SiC-rich $(AlN)_x(SiC)_{(1-x)}$ alloy" refers to an $(AlN)_x(SiC)_{(1-x)}$ alloy where $x \leq 0.5$.

Yet another aspect of the present invention relates to AlN-rich and SiC-rich $(AlN)_x(SiC)_{(1-x)}$ alloy films produced on a substrate by vapor deposition method. In one embodiment, the AlN-rich $(AlN)_x(SiC)_{(1-x)}$ alloy films are produced on a SiC substrate using PVT with AlN and SiC powders under a background pressure of 1-100 torr. In another embodiment, the SiC-rich $(AlN)_x(SiC)_{(1-x)}$ alloy films are produced on a SiC substrate using PVT with AlN and SiC powders under a background pressure of 400-500 torr.

EXAMPLES

Example 1

Preparation of Doped SiC Crystals

SiC crystal was doped with an element or an alloy in the PVD process. The preliminary growth conditions are listed in Table 1.

TABLE 1

Preliminary growth conditions for doped SiC crystals

| | |
|---|---|
| Starting material | SiC + dopant |
| Pressure of the chamber | 10-20 torr |
| Transport Length | 3-4 cm |
| Diameter of crucible | 30 mm |
| Source temperature | 1950° C. |
| $T_S - T_G$ | 20-60 K |
| Growth run time | 4-6 hours |
| Crucible | graphite |
| Furnace | vertical induction |

An x-ray rocking curve is used to determine the crystal quality. The full width of half maxima of this doped crystal is slightly higher than pure SiC crystal.

Example 2

Growth of $(AlN)_x(SiC)_{(1-x)}$ Alloy Film on Axis SiC Wafer $(AlN)_x(SiC)_{(1-x)}$ alloy film was grown on axis 6H—SiC (001) wafer using AlN and SiC powders, for which particles size ranged from 5-10 μm and purity was 99.99% with respect to metals. The preliminary growth conditions are shown in Table 2.

TABLE 2

Preliminary growth conditions for (AlN)x(SiC)(1 − x) alloy film on axis SiC wafer

| | |
|---|---|
| Starting material | AlN and SiC powders |
| Pressure of the chamber | 250 torr |
| Ambient gas | argon |
| Source temperature | 1850° C. |
| $T_S - T_G$ | 70° K |
| Growth run time | 20 hours |
| Substrate | 6H—SiC <001> on-axis |

Example 3

Figure 3:
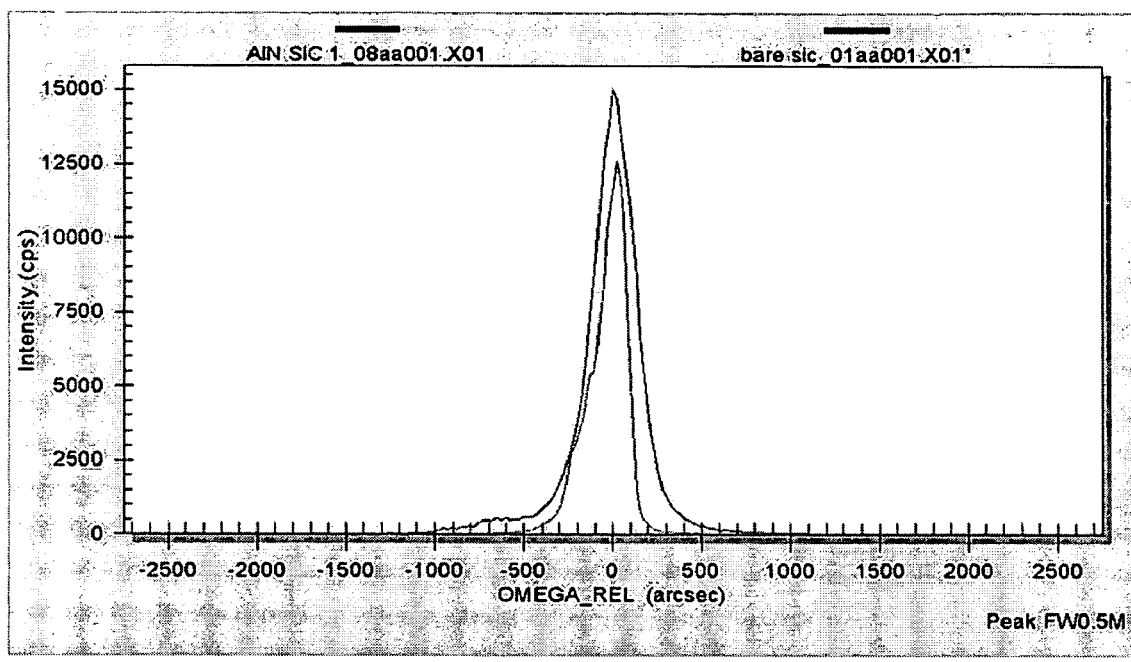
FIG. 3 is a rocking curve of $(AlN)_x(SiC)_{(1-x)}$ alloy film.
Figure 4:
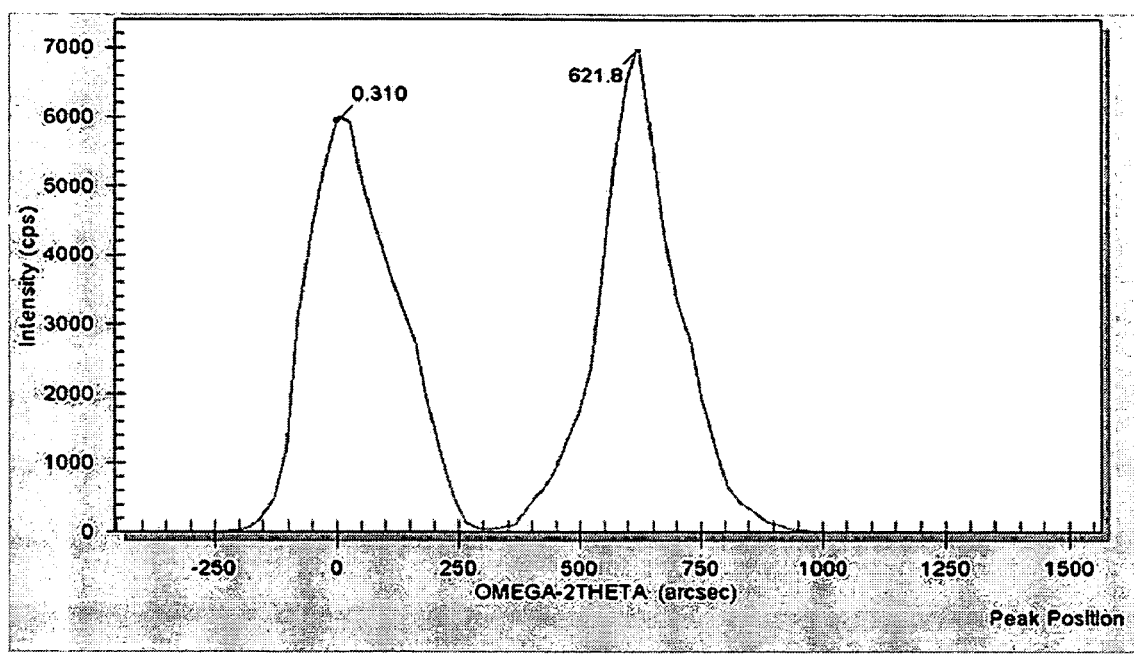
FIG. 4 is a ω-2θ scan of $(AlN)_x(SiC)_{(1-x)}$ alloy film.

Characterization of the $(AlN)_x(SiC)_{(1-x)}$ Alloy Film Grown on the on Axis SiC Wafer As shown in FIG. 3, the $(AlN)_x(SiC)_{(1-x)}$ alloy sample obtained in this experiment contained vast regions of continuous good quality film. FIG. 4 is a rocking curve of $(AlN)_x(SiC)_{(1-x)}$ alloy film. The X-ray rocking curve shows small value indicating good crystallinity.

Figure 5:
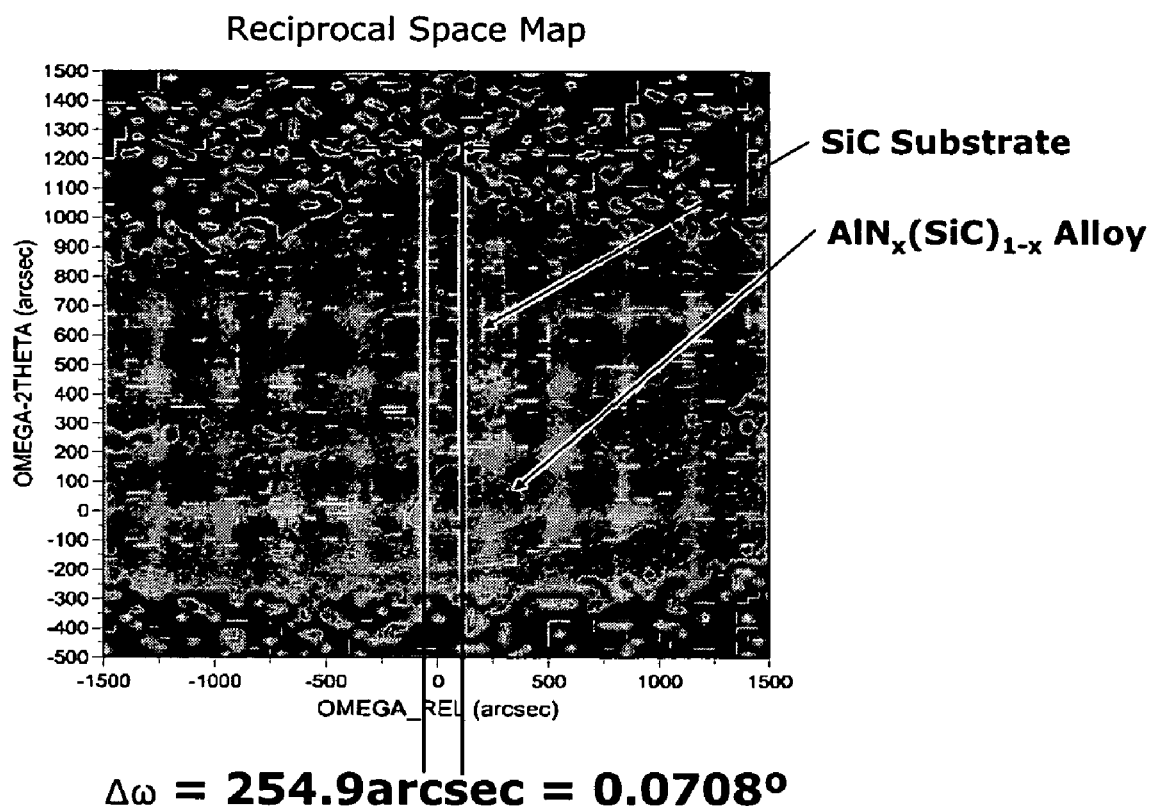
FIG. 5 is a reciprocal space map for determination of crystal tilt of $(AlN)_x(SiC)_{(1-x)}$ alloy film.

FIG. 5 shows a ω-2θ scan of the $(AlN)_x(SiC)_{(1-x)}$ alloy film. The theoretical 2θ is 1515.96 sec between pure AlN (002) reflection and SiC (006) reflection. The measured 2θ is 1242.98 sec. These data suggest that the $(AlN)_x(SiC)_{(1-x)}$ alloy is about 80% AlN and about 20% SiC, i.e., x=0.8.

Figure 6:
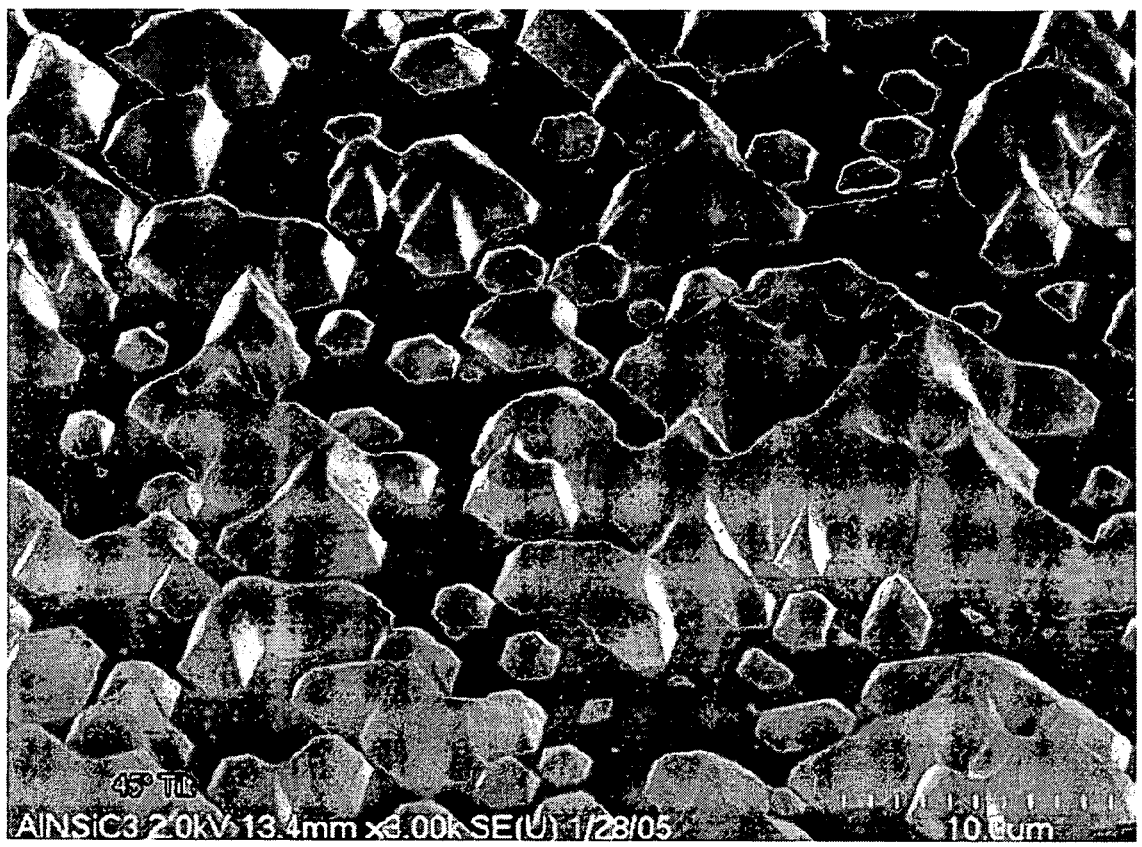
FIG. 6 shows the morphology of GaN film grown on $(AlN)_x(SiC)_{(1-x)}$ substrate.

FIG. 6 is a reciprocal space map for determination of crystal tilt of $(AlN)_x(SiC)_{(1-x)}$ alloy film. The peak splitting along the omega-Rel axis suggests that the alloy film is tilted 254.9 arcsec (Δω=0.0708°) from the SiC substrate surface normal.

Example 4

Growth of GaN Film on $(AlN)_x(SiC)_{(1-x)}$ Substrate

GaN is typically grown on SiC by using a buffer film, such as AlN, on SiC. The AlN buffer, however, is not perfectly crystalline. In this embodiment, no buffer layer of AlN was used. GaN was grown directly on $(AlN)_x(SiC)_{(1-x)}$ substrate by MOCVD process. The morphology of GaN grown on the $(AlN)_x(SiC)_{(1-x)}$ substrate is shown in FIG. 6.

Figure 7:
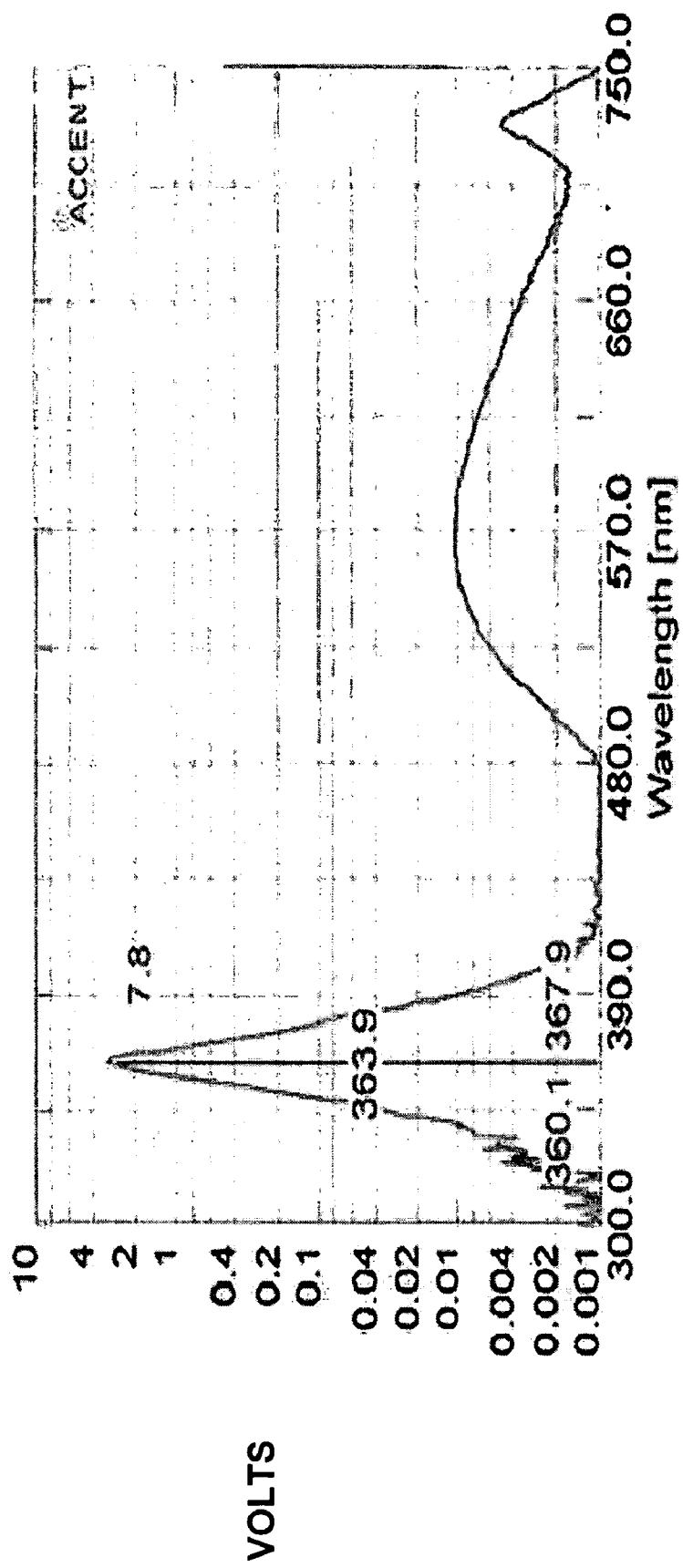
FIG. 7 shows the photoluminescence of GaN film grown on $(AlN)_x(SiC)_{(1-x)}$ substrate.

FIG. 7 shows the photoluminescence of GaN film grown on the $(AlN)_x(SiC)_{(1-x)}$ substrate. The GaN crystal has a band-edge emission at 363.9 nm or 3.4 eV, with a full width half maximum (FWHM) at 7.8 nm or 72 meV. This value is very much comparable with costly and complex process in which AlN buffer is used for GaN growth.

$(AlN)_x(SiC)_{(1-x)}$ is also an excellent substrate for the growth of diamond film. Since $(AlN)_x(SiC)_{(1-x)}$ substrate is stable up to very high temperature compared to Si wafer, it is diamond film can be grown on the $(AlN)_x(SiC)_{(1-x)}$ substrate by CVD, PECVD and other high temperature processes.

The foregoing discussion discloses and describes many exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for producing a semiconductor crystal, comprising
    depositing a semiconductor material on an alloy film by a vapor deposition method,
    wherein the semiconductor material is selected from the group consisting of nitride, carbide and diamond, and wherein the alloy is $(AlN)_x(SiC)_{(1-x)}$ or $Si_xGe_{(1-x)}C$, where 0<x<1.

2. The method of claim 1, wherein the vapor deposition method is selected from the group consisting of PVT, APVT, MOCVD and CVD.

3. The method of claim 2, wherein the semiconductor material comprises GaN and the alloy comprises $(AlN)_x(SiC)_{(1-x)}$, and wherein the vapor deposition method is PVT.

4. The method of claim 1, further comprising the step of:
    forming the alloy film by a vapor deposition method on a substrate prior to depositing the semiconductor material.

5. The method of claim 4, wherein the substrate is selected from the group consisting of carbon, silicon and SiC.

6. The method of claim 5, wherein the substrate comprises SiC.

7. The method of claim 6, wherein the substrate comprises a on-axis 6H—SiC.

8. The method of claim 5, wherein the substrate comprises SiC and the alloy film comprises $(AlN)_x(SiC)_{(1-x)}$, formed by PVT, APVT, MOCVD or CVD.

9. The method of claim 4, further comprising the step of:
    doping the substrate prior to forming the alloy film on the substrate.

10. The method of claim 9, wherein the substrate comprises SiC and is doped with ammonia or trimethyl aluminum in an MOCVD process.

11. The method of claim 4, further comprising the step of: treating the substrate with hexamethyldisilizane and ammonia prior to forming the alloy film on the substrate.

12. The method of claim 1, wherein the semiconductor material comprises SiC and the alloy comprises $(AlN)_x(SiC)_{(1-x)}$.

13. The method of claim 1, wherein the semiconductor material comprises diamond and the alloy comprises $(AlN)_x(SiC)_{(1-x)}$.

14. A method for producing a AlN-rich $(AlN)_x(SiC)_{(1-x)}$ alloy film on a substrate, comprising:
   depositing AlN and SiC on a substrate to form an $(AlN)_x(SiC)_{(1-x)}$ alloy in a PVT process under a background pressure of less than 100 torr using AlN and SiC powder as starting materials.

15. The method of claim 14, wherein the substrate comprises doped SiC.

16. A method for producing a SiC-rich $(AlN)_x(SiC)_{(1-x)}$ alloy film on a substrate, comprising:
   depositing AlN and SiC on a substrate to form an $(AlN)_x(SiC)_{(1-x)}$ alloy in a PVT process under a background pressure of 400-500 torr using AlN and SiC powder as starting materials.

17. The method of claim 16, wherein the substrate comprises doped SiC.

* * * * *

UNITED STATES PATENT AND TRADEMARK OFFICE
CERTIFICATE OF CORRECTION

PATENT NO.        : 7,371,282 B2
APPLICATION NO.   : 11/484691
DATED             : May 13, 2008
INVENTOR(S)       : Narsingh B. Singh et al.

Page 1 of 1

It is certified that error appears in the above-identified patent and that said Letters Patent is hereby corrected as shown below:

Column 1, line 63, the formula "$Si_xGe_{(-x)}C$" should be changed to --$Si_xGe_{(1-x)}C$--.

Signed and Sealed this

Third Day of March, 2009

JOHN DOLL
*Acting Director of the United States Patent and Trademark Office*